United States Patent
Goarin

(10) Patent No.: US 8,063,427 B2
(45) Date of Patent: Nov. 22, 2011

(54) FINFET-BASED NON-VOLATILE MEMORY DEVICE

(75) Inventor: Pierre Goarin, Etterbeek (BE)

(73) Assignee: NXP B.V., Eindhoven (NL)

( * ) Notice: Subject to any disclaimer, the term of this patent is extended or adjusted under 35 U.S.C. 154(b) by 267 days.

(21) Appl. No.: 12/067,992

(22) PCT Filed: Sep. 26, 2006

(86) PCT No.: PCT/IB2006/053489
§ 371 (c)(1),
(2), (4) Date: Mar. 27, 2008

(87) PCT Pub. No.: WO2007/036874
PCT Pub. Date: Apr. 5, 2007

(65) Prior Publication Data
US 2008/0203462 A1    Aug. 28, 2008

(30) Foreign Application Priority Data
Sep. 28, 2005    (EP) ..................................... 05108975

(51) Int. Cl.
*H01L 29/788* (2006.01)
(52) U.S. Cl. .................. 257/314; 257/315; 257/E21.442
(58) Field of Classification Search .................. 257/314, 257/E27.103, 315, E21.442; 365/185.14
See application file for complete search history.

(56) References Cited

U.S. PATENT DOCUMENTS

| | | | |
|---|---|---|---|
| 5,411,905 A * | 5/1995 | Acovic et al. | 438/156 |
| 6,413,802 B1 | 7/2002 | Hu et al. | |
| 6,800,885 B1 | 10/2004 | An et al. | |
| 6,963,104 B2 * | 11/2005 | Wu et al. | 257/315 |
| 7,737,485 B2 * | 6/2010 | Cho et al. | 257/316 |
| 2005/0003592 A1* | 1/2005 | Jones | 438/157 |
| 2005/0013983 A1 | 1/2005 | Hilligoss | |
| 2005/0127362 A1 | 6/2005 | Zhang et al. | |

FOREIGN PATENT DOCUMENTS

| | | |
|---|---|---|
| WO | 03096425 A1 | 11/2003 |
| WO | 2004107351 A1 | 12/2004 |

* cited by examiner

Primary Examiner — Jerome Jackson, Jr.
Assistant Examiner — Paul Budd

(57) ABSTRACT

A non-volatile memory device on a substrate layer (2) comprises source and drain regions (3) and a channel region (4). The source and drain regions (3) and the channel region (4) are arranged in a semiconductor layer (20) on the substrate layer (2). The channel region (4) is fin-shaped and extends longitudinally (X) between the source region and the drain region (3). The channel region (4) comprises two fin portions (4a, 4b) and an intra-fin space (10), the fin portions (4a, 4b) extending in the longitudinal direction (X) and being spaced apart, and the intra-fin space (10) being located in between the fin portions (4a, 4b), and a charge storage area (11, 12; 15, 12) is located in the intra-fin space (10) between the fin portions (4a, 4b).

20 Claims, 3 Drawing Sheets

FINFET-BASED NON-VOLATILE MEMORY DEVICE

FIELD OF THE INVENTION

The present invention relates to a FinFET-based non-volatile memory device.

Also, the present invention relates to a method of manufacturing such a memory device.

BACKGROUND OF THE INVENTION

For reasons of scaling, the use of planar MOSFET structures in device generations with a 65 nm design rule and smaller is becoming more and more complicated due to so-called short channel effects.

An improvement of device characteristics can be obtained by application of a finFET structure.

In a finFET, on top of an insulating layer a (relatively narrow) silicon line (a fin) is created between a source region and a drain region to serve as a channel. Next, a line-shaped control gate is created which crosses the fin. The control gate, which is separated from the fin by a thin gate oxide film surrounds (in cross-section) both the sidewalls and the top of the fin, which allows for a relatively large field effect by the gate on the fin channel.

For Flash memory, an application of a finFET structure as described above has been disclosed in US2005/013983A1. Between the control gate and the fin material a charge trapping layer stack is positioned. Here, the charge trapping stack is positioned on top of the fin. The control gate layer abuts the profile of the charge trapping stack, and also covers the sidewalls of the fin so as to form sidewall transistors.

Disadvantageously, during the manufacturing of prior art finFET flash memory devices, creation of the fin structures and the charge trapping stack on top of them requires lithographic processing with relatively high accuracy to ensure that respective dimensions of fin and charge trapping stack have a minimal variation, since such dimensional variations would strongly influence electronic properties of the finFET memory device.

Moreover, the relatively small contact area between the fin channel and the charge trapping stack results in relatively small currents during sensing (reading) of the memory device and additional amplification of signals may be required. Circuitry for amplification disadvantageously requires an additional footprint on the semiconductor substrate. For such prior art devices with, in particular, relatively small fin dimensions, the lower level of current per cell adversely limits the speed of the device.

SUMMARY OF THE INVENTION

It is an object of the present invention to provide a finFET-based non-volatile memory device which requires less stringent lithographic processing while the influence of variation of dimensions of fins and/or charge trapping stack can be reduced.

The present invention relates to a finFET-based memory device as defined in the claims. The present invention relates to a non-volatile memory device on a substrate layer comprising source and drain regions and a channel region;

the source and drain regions and the channel region being arranged in a semiconductor layer on the substrate layer;

the channel region being fin-shaped and extending longitudinally between the source region and the drain region;

wherein the channel region comprises two fin portions extending in the longitudinal direction and being spaced apart, and an intra-fin space being located in between the fin portions, and a charge storage area being located in the intra-fin space between the fin portions.

Advantageously, in the non-volatile memory device according to the present invention, better control is provided over the position of the fin portions and their dimensions: a reduction is obtained of variations which could occur due to misalignment, since the distance between the fin portions within a memory device is defined by the width of the trench or intra-fin space.

Also, the present invention relates to a method of manufacturing such a finFET-based memory device on a substrate layer, the method comprising:

providing a semiconductor layer on a substrate layer;

forming source and drain regions and a channel region in the semiconductor layer, the channel region being fin-shaped and extending longitudinally between the source region and the drain region;

forming two fin portions within the fin-shaped channel region, the fin portions extending in the longitudinal direction and being spaced apart, with an intra-fin space being located in between the fin portions, and providing a charge storage area in the intra-fin space in between the fin portions.

Moreover, the present invention relates to a memory array comprising at least one non-volatile memory device as described above.

Also, the present invention relates to a semiconductor device comprising at least one non-volatile memory device as described above.

BRIEF DESCRIPTION OF DRAWINGS

The invention will be explained in more detail below with reference to a few drawings in which illustrative embodiments of the invention are shown. It will be appreciated by the person skilled in the art that other alternative and equivalent embodiments of the invention can be conceived and reduced to practice without departing from the true spirit of the invention, the scope of the invention being limited only by the appended claims.

DESCRIPTION OF EMBODIMENTS

Figure 1:
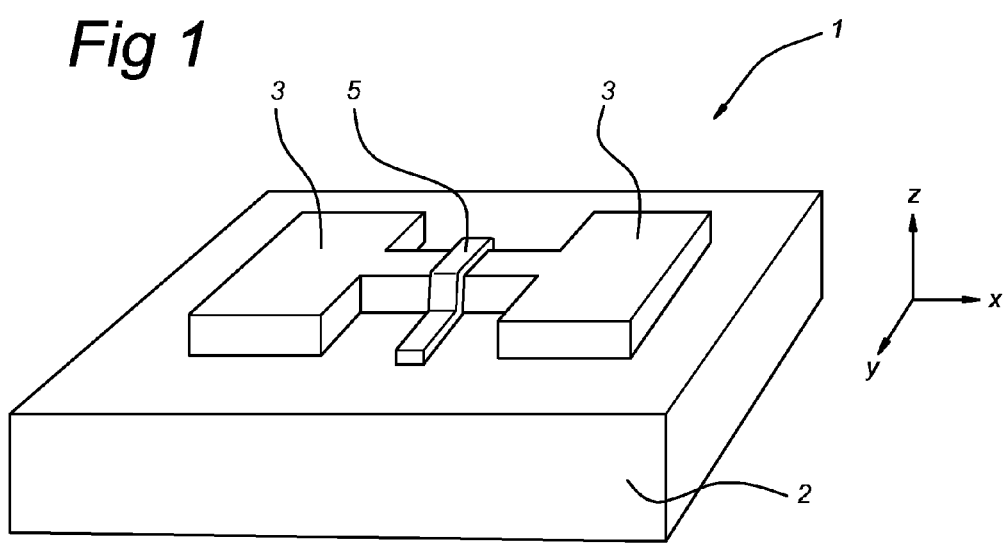
FIG. 1 shows a perspective layout of a finFET-based memory device according to the present invention.

FIG. 1 shows a perspective layout of an embodiment of a finFET-based memory device according to the present invention.

A finFET structure 1 is located on an insulating layer 2, for example a silicon dioxide layer or a BOX (buried oxide) layer of a SOI wafer (SOI: silicon on insulator).

The finFET structure 1 comprises source and drain regions 3 and a (relatively narrow) line or fin 4 which is located between the source and drain regions and interconnects them. Source, drain and fin regions 3, 4 consist of silicon semiconductor material. The fin region 4 has a substantially rectangular cross-section with sidewall portions and a top portion. According to the present invention, the fin region 4 comprises two fin portions which extend in the longitudinal direction X and are spaced apart, with an intra-fin space (not shown) located in between the two fin portions.

The fin region 4 with the two spaced apart fin portions and the intra-fin space will be described below in more detail.

Typically, the length of the fin 4 is between 30 and 50 nm, the width of the fin 4 typically is equal to or less than the length.

A gate 5 is positioned on the insulating layer 2 between the source and drain regions 3 and extends over the fin 4 along the Y direction, substantially perpendicularly to the length direction X of the fin 4. The gate 5 is separated from the fin 4 by a gate oxide layer (not shown).

The gate 5 can be created by a deposition process in which a suitable mask is defined by lithography.

In this example the gate 5 is shown as a thin line-shaped layer, but alternatively it may be plate-shaped, depending on its height (direction Z) in comparison to the height of the fin 4.

The gate material can be any suitable material such as doped poly-silicon or a metal.

In the following, the method of manufacturing the memory device according to the present invention will be described in more detail with reference to FIGS. 2 to 7.

Figure 2:
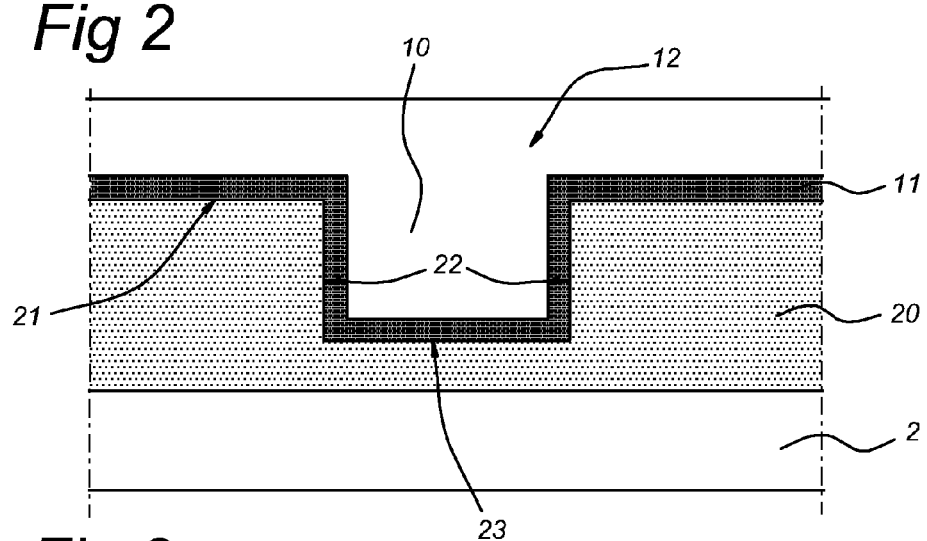
FIG. 2 shows a cross-sectional view of the finFET-based memory device of FIG. 1.

FIG. 2 shows a cross-sectional view of the finFET-based memory device of FIG. 1 after a manufacturing step.

On a SOI substrate (SOI: silicon 20 on insulator 2), in the semiconductor silicon layer 20 a trench 10 is etched using a trench mask (not shown). Next, an insulating layer 11 comprising silicon dioxide is deposited which covers a top surface 21 of the silicon layer 20 and a bottom 23 and sidewalls 22 of the trench 10. Then, a poly-silicon layer 12 is deposited in such a way that it fills the trench region 10 and covers the surrounding top surface 21 of the silicon layer 20.

In an alternative step, instead of the insulating layer 11 a charge trapping stack 15 consisting of a first dielectric layer, a charge trapping layer and a second dielectric layer is deposited. A well known charge trapping stack is a so-called ONO stack which consists of a silicon dioxide layer, a silicon nitride layer and a second silicon dioxide layer. Instead of silicon dioxide, either one of the dielectric layers in the charge trapping stack 15 may also consist of high-K materials, such as Hafnium-oxide $HfO_2$, Hafnium-silicate $Hf_xSi_{1-x}O_2$ ($0 \leq x \leq 1$), Hafnium-silicate-nitride HfSiON, Aluminum-oxide $Al_2O_3$ or Zirconium-oxide $ZrO_2$.

Figure 3:
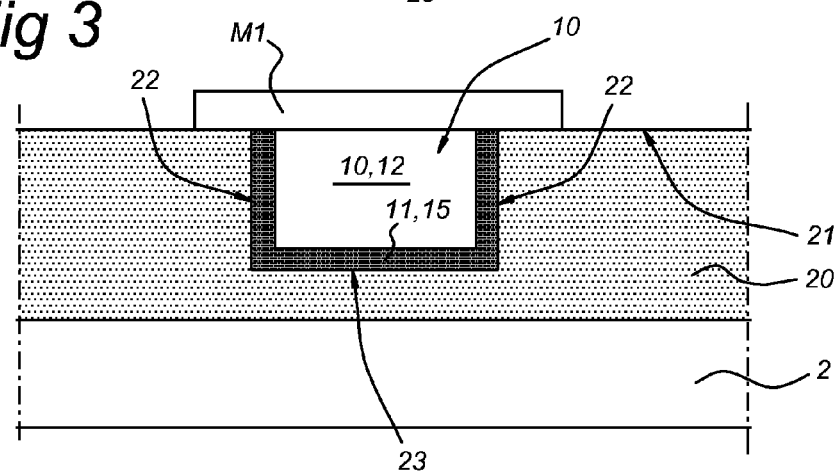
FIG. 3 shows a cross-sectional view of the finFET-based memory device of FIG. 1 after a manufacturing step.

FIG. 3 shows a cross-sectional view of the finFET-based memory device of FIG. 1 after a subsequent manufacturing step.

Next, for planarising the structure, a chemical mechanical polishing (CMP) process is carried out to remove the poly-silicon 12, followed by a wet etch to remove the insulating layer 11 (or the charge trapping stack 15) from the top surface 21 of the silicon layer 20. In the trench region 10, on the inner sidewalls and the bottom wall, the insulating layer 11 (or charge trapping stack 15) and the poly-silicon line 12 remain.

After planarisation (CMP and wet etch), the top surface of the poly-silicon line 12 is substantially level with the top surface 21 of the silicon layer 20.

Next, a mask M1 is defined above the trench region 10: the mask layer M1 covers the trench region 10 and extends over the top surface in order to cover a surrounding portion of the silicon layer 20 adjacent to the sidewalls 22 of the trench 10.

Furthermore, the mask M1 is shaped such that the source and drain regions 3 are covered as well.

Figure 4:
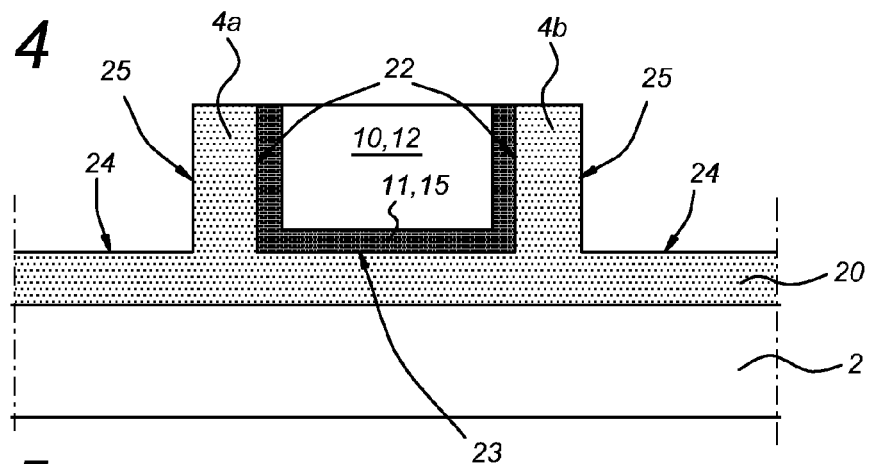
FIG. 4 shows a cross-sectional view of the finFET-based memory device of FIG. 1 after a subsequent manufacturing step.

FIG. 4 shows a cross-sectional view of the finFET-based memory device of FIG. 1 after a further manufacturing step.

A dry-etching process is carried out to remove the portion of the silicon layer 20 which was not covered by the mask M1. By etching, a free surface 24 of the semiconductor layer 20 is obtained which is substantially on the same level as the bottom level 23 of the trench region 10.

Then, the mask M1 is removed. Due to the fact that the mask M1 extended over a portion of the silicon layer 20 outside of the trench region 10, two line-shaped silicon regions or fin portions 4a, 4b have been formed adjacent to the region of the insulating layer 11 (or charge trapping stack 15) and the poly-silicon line 12 in the trench region 10. Also, during this dry-etching step, the source and drain regions 3 have been formed.

Consequently, the fin region 4 comprises two fin portions 4a, 4b spaced apart with an intra-fin space 10, i.e. the trench 10, in between the two fin portions. Each fin portion 4a, 4b extends lengthwise between the source region and the drain region, and each fin portion 4a, 4b has an open uncovered sidewall 25, directed outwards from the trench or intra-fin space 10.

In the finFET-based memory device according to the present invention, the area of the fin 4 that interfaces with a charge storage region (i.e. the poly-silicon 12 or the charge trapping stack 15) is relatively large, which advantageously results in a relatively high level of current per cell.

Figure 5:
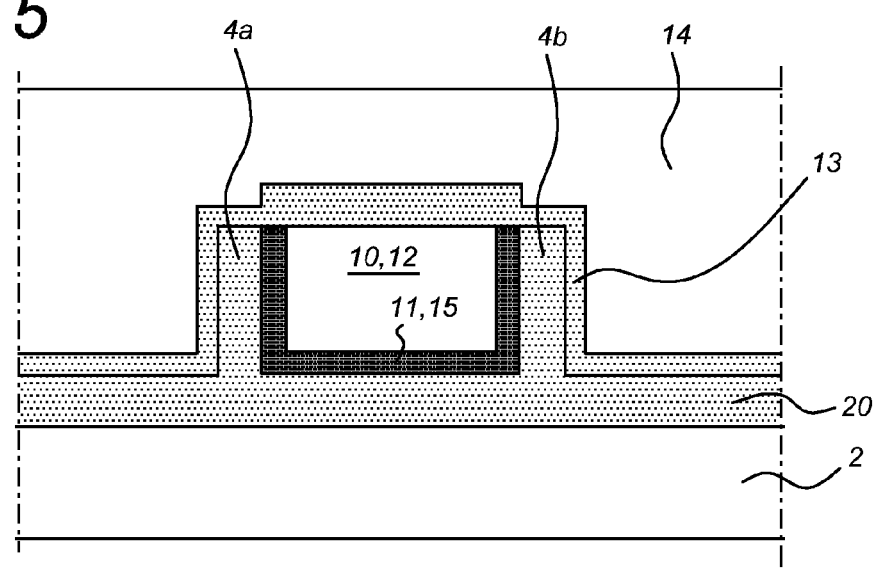
FIG. 5 shows a cross-sectional view of the finFET-based memory device of FIG. 1 after a further manufacturing step.

FIG. 5 shows a cross-sectional view of the finFET-based memory device of FIG. 1 after another successive manufacturing step.

In another successive step, the top surface 24, the open sidewalls 25 of the fin portions 4a, 4b, the end regions of the dielectric layer 11 (or the charge trapping stack 15) at a top surface 26 of the intra-fin space 10 and the top surface 26 of the poly-silicon line 12 in the intra-fin space 10 are covered by a gate oxide layer 13. After formation of the gate oxide layer 13, a second poly-silicon layer 14 is deposited to cover the structure.

Figure 6:
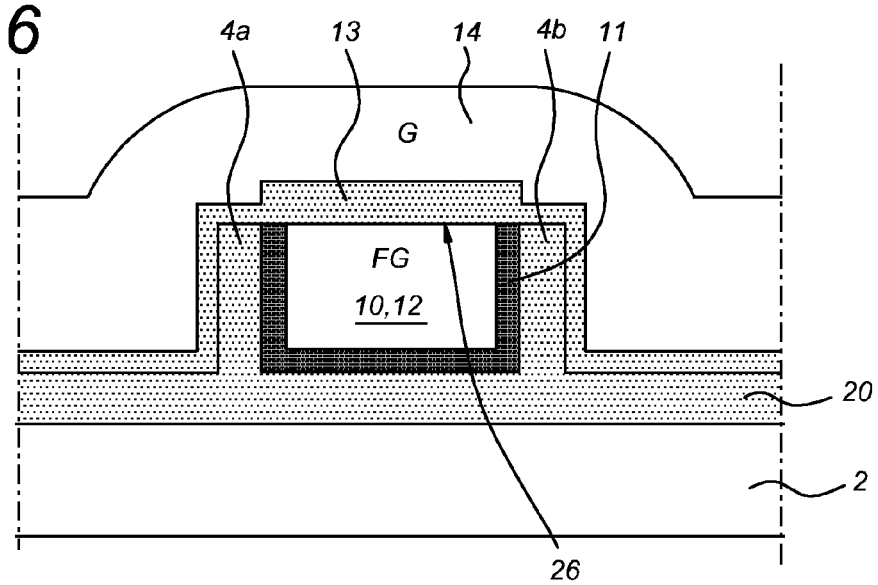
FIG. 6 shows a cross-sectional view of the finFET-based memory device in a first embodiment.

FIG. 6 shows a cross-sectional view of the finFET-based memory device in a first embodiment.

After patterning the second poly-silicon layer 14, a gate G is formed which surrounds the fin portions 4a, 4b, the end regions of the dielectric layer 11 and the poly-silicon line 12 in the intra-fin space 10, with the gate oxide 13 being used to separate the fin portions 4a, 4b, the end regions of the dielectric layer 11 and the poly-silicon line 12 from the gate G.

In the first embodiment, the non-volatile memory device has a charge storage area 11, 12 which comprises the insulating layer 11 and the poly-silicon line 12 in the intra-fin space 10 which acts as a floating gate FG for charge storage. In the case of the first embodiment, the gate G acts as a control gate.

Advantageously, the method as described above provides a non-volatile memory device in which, due to less stringent lithographic processing, better control over the position of the fin portions 4a, 4b and their dimensions is obtained. Note that instead of the use of a direct definition of their size, the fin portions 4a, 4b, are defined by an overlap of the trench mask and the mask M1, i.e. the size difference between the trench mask and the mask M1, while maintaining proper alignment of the two masks. The method reduces the variations which could occur due to misalignment during direct definition of the fin portions 4a, 4b.

Typically, the height of the fin portions 4a, 4b is between about 30 and about 100 nm. The width of the fin portions 4a, 4b is equal to, or less than, the height of the fin portions 4a, 4b. The width of the intra-fin space 10 is between about 50 and 150 nm. The thickness of the gate oxide layer 13 is between 1 and about 10 nm.

The thickness of the insulating layer 11 is between about 4 and about 10 nm. The thickness of the gate 14, G is between about 50 and about 150 nm.

Figure 7:
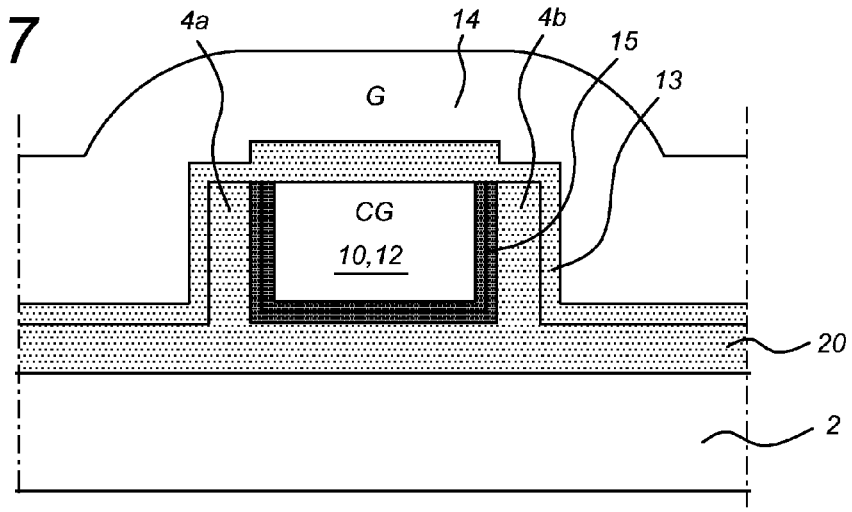
FIG. 7 shows a cross-sectional view of the finFET-based memory device in a second embodiment.

FIG. 7 shows a cross-sectional view of the finFET-based memory device in a second embodiment.

After patterning the second poly-silicon layer 14, a gate G is formed which surrounds the outer sidewalls 25 of the fin portions 4a, 4b, the end regions of the charge trapping stack 15 and the poly-silicon line 12, the gate oxide 13 being used to separate the fin portions 4a, 4b, the end regions of the charge trapping stack 15 and the poly-silicon line 12 from the gate G.

In the second embodiment the non-volatile memory device has a charge storage area 15, 12 which comprises the charge trapping stack 15 interposed between the fin portions 4a, 4b plus the bottom surface 23 of the intra-fin space 10 and the poly-silicon layer in the intra-fin space 10. In this case the poly-silicon line 12 acts as a control gate CG which can control actions for storing charge in the charge trapping stack 15. The gate G, in the case of the second embodiment, acts as an access gate.

Typically, the height of the fin portions 4a, 4b is between about 30 and about 100 nm. The width of the fin portions 4a, 4b is equal to, or less than, the height of the fin portions 4a, 4b. The width of the intra-fin space 10 is between about 50 and 150 nm. The thickness of the gate oxide layer 13 is between 1 and about 10 nm.

The thickness of the first silicon dioxide dielectric layer of the charge trapping stack 15 is between about 1 and about 3 nm. The thickness of the charge trapping silicon nitride layer of the charge trapping stack 15 is between about 4 and about 10 nm. The thickness of the second silicon dioxide dielectric layer of the charge trapping stack 15 is between about 4 and about 25 nm. The thickness of the gate 14, G is between about 50 and about 150 nm.

In a further backend process, a passivation layer (not shown) may be formed in which contacts (not shown) to source and drain regions 3, to gate G and, as applicable in the second embodiment, to the control gate CG can be formed, as known to persons skilled in the art.

Figure 8:
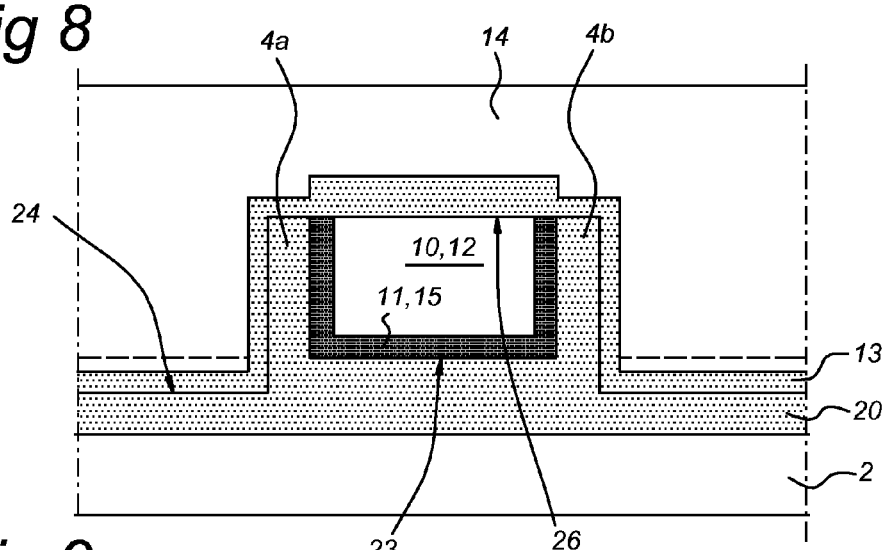
FIG. 8 shows a cross-sectional view of the finFET-based memory device according to a third embodiment.

FIG. 8 shows a cross-sectional view of the finFET-based memory device according to a third embodiment.

In the third embodiment, the etching of the top surface 21 is done in such a way that, after etching, the free surface 24 is substantially at a lower level than the bottom level 23 of the intra-fin space region 10. To indicate the difference between the bottom level 23 and the free surface level 24, dashed horizontal lines at the same level as the bottom level 23 are shown in FIG. 8. In this manner it is achieved that, in operation, better control over the electric field in the corner regions between the free surface and the fin portions 4a, 4b can be obtained. This ensures that the control gate has better control of the bottom region of the fin below the intra-fin space 10 (the bottom region below the intra-fin 10 consisting of silicon).

Typically, the etch results in a difference in level between the free surface 24 and the bottom surface 23 of the intra-fin space 10 of between, say, 30 and 100 nm. Other sizes and dimensions can be as described above with reference to FIG. 6 or FIG. 7.

Note that poly-silicon line 12 can be either a floating gate or a control gate in this embodiment. Depending on the poly-silicon line 12 acting as floating gate FG or control gate CG, either the insulating layer 11 or the charge trapping stack 15 is interposed between the fin portions 4a, 4b and the poly-silicon line 12. If the poly-silicon line 12 is used as floating gate FG, the gate 14, G acts as control gate. If the poly-silicon line 12 is used as control gate CG to control charge storage in the charge trapping stack 15, the gate 14, G acts as access gate.

Figure 9:
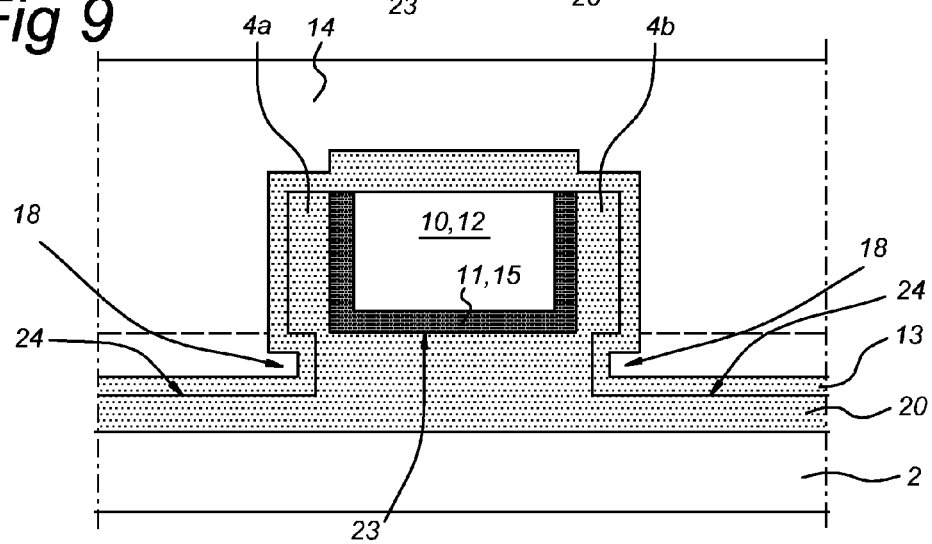
FIG. 9 shows a cross-sectional view of the finFET-based memory device according to a fourth embodiment.

FIG. 9 shows a cross-sectional view of the finFET-based memory device according to a fourth embodiment.

In the fourth embodiment, the etching of the top surface 21 is done in such a way that, after etching, the free surface 24 of the silicon layer 20 is substantially at a lower level than the bottom level 23 of the intra-fin space region 10 and that at the same time an undercut 18 of the fin portions 4a, 4b is obtained. This undercut can be obtained by providing spacers (not shown) on the open sidewalls 25, as shown in FIGS. 4 and 5, and subsequently applying an isotropic (wet) etch to etch away silicon below the spacers. To indicate the difference between the bottom level 23 and the free surface level 24, dashed horizontal lines at the same level as the bottom level 23 are shown in FIG. 9.

Typically, the etching process results in a difference in level between the free surface 24 and the bottom surface 23 of the intra-fin space 10 of between about 30 and about 100 nm. The undercut of the fin portions 4a, 4b will be somewhat less than the under-etch, i.e. less than the width of the respective fin portion. Other sizes and dimensions may be similar to those described above with reference to FIG. 6 or FIG. 7.

Again, similar to the third embodiment, it is achieved that, in operation, better control over the electric field in the corner regions between the free surface and each of the fin portions 4a, 4b can be obtained.

Note that also in this embodiment the poly-silicon line 12 can act as either a floating gate FG or a control gate CG. If the poly-silicon line 12 is used as floating gate FG, the gate 14, G acts as control gate. If the poly-silicon line 12 is used as control gate CG to control charge storage in the charge trapping stack 15, the gate 14, G acts as access gate.

Finally, it is noted that in the embodiments that use the control gate CG in combination with the charge trapping stack 15, e.g., the ONO stack, the read disturb of the memory cell can be reduced, since the control gate CG is used only for (dis)charging the charge trapping stack 15.

Also, due to the relatively larger current (during read) that is provided per cell, the requirement for amplification circuits in an array of memory devices according to the present invention is less than in the prior art. Typically, the footprint of such circuits in comparison to the area occupied by the novel memory devices is smaller than in the prior art.

The invention claimed is:
1. Non-volatile memory device on a substrate layer, comprising;
source, drain and channel regions arranged in a semiconductor layer on the substrate layer;
the channel region being fin-shaped, extending longitudinally between the source region and the drain region and having two fin portions and an intra-fin space, the fin portions extending in the longitudinal direction and being spaced apart, and the intra-fin space being located in between the fin portions; and a charge storage area of material, located in the intra-fin space between the fin portions, the fin portions having opposing inner sidewalls configured and arranged to face each other thereby defining an outermost periphery of the charge storage area of material in a lateral direction that is about perpendicular to the longitudinal direction of the channel region.

2. Non-volatile memory device according to claim 1,
wherein each fin portion has an outer sidewall that faces away from the other fin portion,
wherein the charge storage area of material that couples charge directly between the source and drain regions is located between the inner sidewalls;
further including a gate oxide layer that is on the outer sidewalls of and over the fin portions and the charge storage area of material in the intra-fin space, and
further including a gate layer on the gate oxide layer laterally adjacent the outer sidewalls of and over the fin portions, the gate oxide layer separating the fin portions and the charge storage area of material from the gate layer.

3. Non-volatile memory device according to claim 2, wherein the charge storage area of material comprises a dielectric layer and a poly-silicon layer; the dielectric layer being interposed between the fin portions plus a bottom surface of the intra-fin space and the poly-silicon layer, the poly-silicon layer being arranged to act, during operation, as a floating gate and the gate being arranged to act as a control gate.

4. Non-volatile memory device according to claim 1, wherein a level of a free surface of the semiconductor layer is below a level of the bottom surface of the intra-fin space.

5. Non-volatile memory device according to claim 1, wherein a level of a free surface of the semiconductor layer is below a level of the bottom surface of the intra-fin space, and an undercut is present at a lower region of the fin portions near the free surface.

6. A non-volatile memory device according to claim 1,
wherein the charge storage area of material and source, drain, and channel regions are part of a memory cell,
further including a plurality of such memory cells in a memory array.

7. A non-volatile memory device according to claim 1, wherein the charge storage area of material and source, drain, and channel regions are part of a memory cell of a semiconductor device.

8. A non-volatile memory device according to claim 1,
further including a gate layered along outer sidewalls of the fin-shaped channel region,
wherein the gate, charge storage area of material and source, drain, and channel regions form a memory cell, the fin-shaped channel region connecting the source and drain regions of the single memory cell.

9. A non-volatile memory device according to claim 1, wherein the source, drain and channel regions are of a single memory cell and the fin-shaped channel region extends exclusively between the source and drain regions, the source and drain regions respectively extending laterally beyond outer sidewalls of the fin-shaped channel region that respectively contact the source and drain regions.

10. Non-volatile memory device on a substrate layer comprising:
source, drain and channel regions arranged in a semiconductor layer on the substrate layer;
the channel region being fin-shaped, extending longitudinally between the source region and the drain region and having two fin portions and an intra-fin space, the fin portions extending in the longitudinal direction and being spaced apart, and the intra-fin space being located in between the fin portions, wherein each fin portion has an inner sidewall that faces the other fin portion and an outer sidewall that faces away from the other fin portion;
a gate oxide layer that is on the outer sidewalls of and over the fin portions and a charge storage area located in the intra-fin space;
a gate layer on the gate oxide layer laterally adjacent the outer sidewalls of and over the fin portions, the gate oxide layer separating the fin portions and the charge storage area from the gate layer; and
wherein the charge storage area comprises a charge trapping stack and a poly-silicon layer; the charge trapping stack being interposed between the fin portions plus a bottom surface of the intra-fin space and the poly-silicon layer; the charge trapping stack comprising a first dielectric layer, a charge trapping layer and a second dielectric layer, and the poly-silicon layer being arranged to act, during operation, as a control gate and the gate layer being arranged to act as an access gate.

11. Non-volatile memory device according to claim 10, wherein the charge trapping layer is a silicon nitride layer.

12. Non-volatile memory device according to claim 10, wherein each of the first and second dielectric layer comprises either silicon dioxide or a high-K material.

13. Method of manufacturing a non-volatile memory device, the method comprising:
providing a semiconductor layer on a substrate layer;
forming source and drain regions and a channel region in the semiconductor layer, the channel region being fin-shaped and extending longitudinally between the source region and the drain region;
forming two fin portions within the fin-shaped channel region, the fin portions extending in the longitudinal direction and being spaced apart, with an intra-fin space being located between the fin portions; and
providing a charge storage area of material in the intra-fin space between the fin portions, the fin portions having opposing inner sidewalls configured and arranged to face each other thereby defining a periphery of the charge storage area of material that laterally bounds an outermost portion of the charge storage material in a direction that is about perpendicular to the longitudinal direction of the channel region.

14. Method of manufacturing a non-volatile memory device according to claim 13, wherein the method further comprises:
providing a gate oxide layer covering the fin portions and the charge storage area of material in the intra-fin space, and
providing a gate layer which surrounds the fin portions and the charge storage area of material, the gate oxide separating the fin portions and the charge storage area of material from the gate layer.

15. Method of manufacturing a non-volatile memory device according to claim 13, wherein the method further comprises:
providing a passivation layer for covering the non-volatile memory device, and
forming contacts through the passivation layer to at least the source and drain regions and a gate layer around and separated from the fin portions and the charge storage area of material by a gate oxide.

16. Method of manufacturing a non-volatile memory device, the method comprising:
providing a semiconductor layer on a substrate layer;

forming source and drain regions and a channel region in the semiconductor layer, the channel region being fin-shaped and extending longitudinally between the source region and the drain region;

forming two fin portions within the fin-shaped channel region, the fin portions extending in the longitudinal direction and being spaced apart, with an intra-fin space being located between the fin portions; and providing a charge storage area of material in the intra-fin space between the fin portions, the fin portions having opposing inner sidewalls configured and arranged to face each other thereby defining a periphery of the charge storage area of material;

etching a trench, as the intra-fin space, in the semiconductor layer by using a trench mask;

depositing a layer stack for forming the charge storage area of material in the intra-fin space;

planarising the layer stack in such a way that a top surface of the layer stack is substantially level with a top surface of the semiconductor layer;

providing a mask over the planarised layer stack and a surrounding portion of the semiconductor layer adjacent to the trench, and etching the semiconductor layer portion not covered by the mask to form the fin portions.

17. Method of manufacturing a non-volatile memory device according to claim 16, wherein the method further comprises etching the semiconductor layer for providing a free surface of the semiconductor layer which is substantially on a same level as a bottom level of the trench.

18. Method of manufacturing a non-volatile memory device according to claim 16, wherein the method further comprises etching the semiconductor layer for providing a free surface of the semiconductor layer which is substantially on a level below a bottom level of the trench.

19. Method of manufacturing a non-volatile memory device according to claim 18, wherein the method further comprises etching the semiconductor layer for providing an undercut of the fin portions.

20. A non-volatile memory device comprising
a substrate layer;
a semiconductor layer on the substrate layer;
a source region in the semiconductor layer;
a drain region in the semiconductor layer;
in the semiconductor layer, a fin-shaped channel region extending in a longitudinal direction between the source and drain regions, the fin-shaped channel region including
two fin portions extending in the longitudinal direction and defining an intra-fin space located between the fin portions, and
in the intra-fin space, a poly-silicon layer and a charge storage region including a charge trapping stack having a first dielectric layer, a charge trapping layer and a second dielectric layer; and
a gate oxide layer over the two fin portions and the intra-fin space.

* * * * *